(12) United States Patent
Shaw et al.

(10) Patent No.: US 12,079,054 B2
(45) Date of Patent: Sep. 3, 2024

(54) VOLTAGE IDENTIFICATION SIGNAL DECODER

(71) Applicant: TEXAS INSTRUMENTS INCORPORATED, Dallas, TX (US)

(72) Inventors: Vishal Shaw, West Bengal (IN); Preetam Tadeparthy, Bangalore (IN); Mayank Jain, Bangalore (IN); Karthik Anyam, Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 17/874,696

(22) Filed: Jul. 27, 2022

(65) Prior Publication Data

US 2024/0036624 A1 Feb. 1, 2024

(51) Int. Cl.
*G06F 1/26* (2006.01)
*H02M 3/04* (2006.01)
*H03M 7/02* (2006.01)

(52) U.S. Cl.
CPC ............ *G06F 1/26* (2013.01); *H02M 3/04* (2013.01); *H03M 7/02* (2013.01)

(58) Field of Classification Search
CPC ........................................................ G06F 1/26
See application file for complete search history.

(56) References Cited

U.S. PATENT DOCUMENTS

| 6,697,952 | B1* | 2/2004 | King | G06F 1/26 |
| | | | | 713/340 |
| 2002/0073346 | A1* | 6/2002 | Yu | G06F 1/26 |
| | | | | 713/300 |
| 2002/0087896 | A1* | 7/2002 | Cline | G06F 1/3203 |
| | | | | 713/300 |
| 2002/0109489 | A1* | 8/2002 | Shaver | G06F 1/26 |
| | | | | 323/283 |

(Continued)

FOREIGN PATENT DOCUMENTS

JP    WO2020178954 A1 *  4/2019

OTHER PUBLICATIONS

Bhattacharyya: Successive Approximation Algorithm for Binary Division of Unsigned Integers; International Journal of Information and Electronics Engineering, vol. 2, No. 4, Jul. 20212.

*Primary Examiner* — Phil K Nguyen
(74) *Attorney, Agent, or Firm* — Michelle F. Murray; Frank D. Cimino (57) ABSTRACT

One example includes a VID signal decoder circuit. The circuit includes a coarse resolution decoder that receives a VID signal. The VID signal can be encoded with a digital value of an output voltage. The coarse resolution decoder can decode the VID signal to generate a first digital signal. The circuit also includes a fine resolution decoder that receives the VID signal and to decode the VID signal to generate a second digital signal. The circuit further includes a multiplexer to provide the first digital signal as an output signal responsive to a first state of a selection signal and to (Continued)

provide the second digital signal as the output signal responsive to a second state of the selection signal. The first and second states of the selection signal can be based on a relative amplitude of the first and second digital signals.

20 Claims, 4 Drawing Sheets (56) References Cited

U.S. PATENT DOCUMENTS

| | | | | |
|---|---|---|---|---|
| 2002/0188874 | A1* | 12/2002 | Yu | G06F 1/26 |
| | | | | 713/300 |
| 2003/0001664 | A1* | 1/2003 | Nguyen | G05F 1/577 |
| | | | | 327/544 |
| 2012/0091977 | A1* | 4/2012 | Carroll | H02M 3/1584 |
| | | | | 323/271 |
| 2012/0260000 | A1* | 10/2012 | Tong | G06F 13/4291 |
| | | | | 710/5 |
| 2018/0337585 | A1* | 11/2018 | Xu | G06F 1/26 |
| 2021/0218334 | A1* | 7/2021 | Radhakrishnan | H02M 3/1566 |
| 2023/0299860 | A1* | 9/2023 | Onohara | H04B 17/22 |
| | | | | 375/224 |

\* cited by examiner

FIG. 4

VOLTAGE IDENTIFICATION SIGNAL DECODER

TECHNICAL FIELD

This description relates generally to electronic systems, and more particularly to a voltage identification signal (VID) decoder.

BACKGROUND

Power supply circuits are implemented in all modern computers that require a direct current (DC) voltage. Typically, power supply circuits are provided in a voltage regulator circuit that provides an output voltage to other components in a computer system, such as a central processing unit (CPU). As computational resources have improved based on technological improvements to computer processing, some high-end CPUs implement dynamic voltage transitions, such that the CPU can dictate the amount of supply voltage it requires to perform. At higher performances that require larger computational resources, the CPU can require a higher supply voltage. Conversely, when the CPU does not require large computational resources, the CPU may only require a small supply voltage, thereby conserving power. The CPU can communicate such power requests to a power controller of the voltage regulator. Accordingly, the CPU can request the amplitude of the output voltage provided from the voltage regulator that is provided as the supply voltage to the CPU to optimize performance and power consumption.

SUMMARY

One example includes a VID signal decoder circuit. The circuit includes a coarse resolution decoder that receives a VID signal. The VID signal can be encoded with a digital value of an output voltage. The coarse resolution decoder can decode the VID signal to generate a first digital signal. The circuit also includes a fine resolution decoder that receives the VID signal and to decode the VID signal to generate a second digital signal. The circuit further includes a multiplexer to provide the first digital signal as an output signal responsive to a first state of a selection signal and to provide the second digital signal as the output signal responsive to a second state of the selection signal. The first and second states of the selection signal can be based on a relative amplitude of the first and second digital signals.

Another example includes a circuit. The circuit includes a coarse resolution decoder having a VID signal input to receive a VID signal, a first digital output that provides a first digital signal, and a second digital output. The circuit also includes a fine resolution decoder having the VID signal input, a first digital output that provides a second digital signal, and a second digital output. The circuit also includes a multiplexer having a first multiplexer input coupled to the first digital output of the coarse resolution decoder, a second multiplexer input coupled to the first digital output of the fine resolution decoder, a selection input, and an output to provide one of the first digital signal or the second digital signal as a digital output signal. The circuit further includes a resolution selector having a first input coupled to the second digital output of the coarse resolution decoder, a second input coupled to the second digital output of the fine resolution decoder, and a selection output coupled to the selection input of the multiplexer.

Another example described herein includes a voltage regulator circuit. The circuit includes power stages that are each configured to provide respective contributions of an output voltage provided to a CPU. The circuit also includes a power controller configured to receive a VID signal from the CPU and to selectively activate the power stages based on a value of an output signal to adaptively control the output voltage to the CPU. The VID signal being encoded with a digital value of an output voltage from the CPU. The power controller includes a VID signal decoder circuit. The VID signal decoder circuit includes a coarse resolution decoder configured to receive the VID signal. The coarse resolution decoder can further be configured to decode the VID signal to generate a first digital signal. The VID signal decoder circuit also includes a fine resolution decoder configured to receive the VID signal and to decode the VID signal to generate a second digital signal. The VID signal decoder circuit further includes a multiplexer configured to provide the first digital signal as the output signal responsive to a first state of a selection signal and to provide the second digital signal as the output signal responsive to a second state of the selection signal. The first and second states of the selection signal can be based on a relative amplitude of the first and second digital signals.

DETAILED DESCRIPTION

This description relates generally to electronic systems and, more particularly, to a voltage identification (VID) signal decoder. The VID signal decoder can be implemented in a power controller of a voltage regulator circuit that implements adaptive output voltage in a computer system. For example, the computer system can include a central processing unit (CPU) that can implement an adaptive supply voltage, such that the CPU can provide the VID signal to request an appropriate amplitude of an output voltage provided from the voltage regulator circuit to be provided as the supply voltage to the CPU. The VID signal can be provided as a pulse-width modulated (PWM) signal having a duty-cycle that can be an encoded amplitude of the requested supply voltage. For example, the VID signal can have an eight-bit signal encoded therein to specify the amplitude of the supply voltage to the CPU.

The VID signal decoder can thus be configured to decode the VID signal to determine the amplitude of output voltage provided from the voltage regulator circuit to the CPU. The VID signal decoder can include a coarse resolution decoder that provides a first digital signal that is a coarse duty-cycle code that is the decoded VID signal and a fine resolution decoder that provides a second digital signal that is a fine duty-cycle code that is the decoded VID signal. As described herein, the coarse resolution decoder can provide a more rapid decoding of the VID signal at lesser accuracy, and the fine resolution decoder can provide a slower decoding of the VID signal at greater accuracy. As an example, the coarse resolution decoder can include a counter configured to determine an on-time and an off-time of each period of the PWM VID signal, and can include a PWM decoder configured to implement a decoding algorithm to generate the first digital signal based on a relative difference between the on-time and the off-time of the PWM VID signal. As another example, the fine resolution decoder can include an analog filter configured to filter the PWM VID signal to generate an analog signal representative of the duty-cycle of the PWM VID signal and an analog-to-digital converter (ADC) configured to generate a digital representation of the analog signal representative of the duty-cycle of the PWM VID signal.

The VID signal decoder can also include a multiplexer that receives the first and second digital signals output from the respective coarse and fine decoders and is configured to provide one of the first and second digital signals as an output based on a selection signal. Therefore, the output signal provided by the multiplexer can be the decoded VID signal provided from one of the coarse and fine decoders. The selection signal can be provided based on a relative difference in amplitude between the first and second digital signals, such as to within a predetermined number of least significant bits (LSBs) (e.g., two LSBs). For example, the selection signal can initially be provided at a first state, such that multiplexer provides the first digital signal as the output to provide a rapid decoding of the VID signal via the coarse resolution decoder. Thus, the output voltage can begin to rapidly converge on the amplitude requested by the VID signal, as provided by the first digital signal. In response to the second digital signal being close in amplitude to the first digital signal (e.g., withing two LSBs), the selection signal can switch to a second state, such that the multiplexer provides the second digital signal as the output to provide a more accurate decoding of the VID signal via the find decoder. Accordingly, the VID signal decoder can provide both rapid (e.g., approximately 10 μs or less) and accurate decoding of the VID signal.

Figure 1:
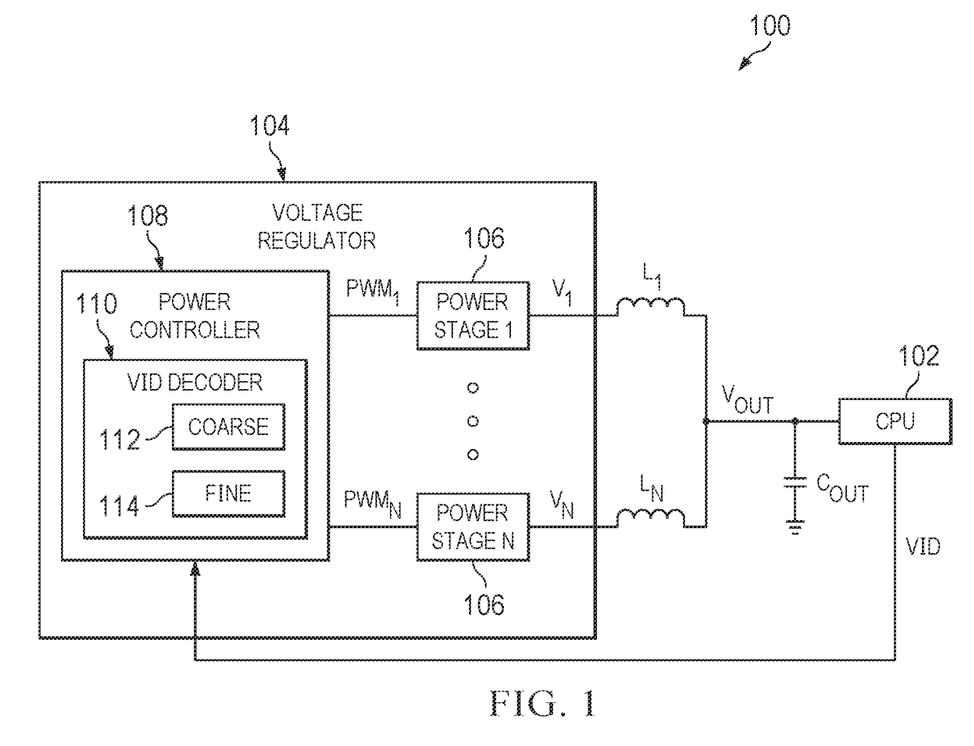
FIG. 1 is an example block diagram of a computer system.

FIG. 1 is an example of a computer system 100. The computer system 100 can be implemented as part of any of a variety of computing devices, such as computers, mobile devices, or any other computing device. The computer system 100 includes a central processing unit (CPU) 102 that is configured to implement any of a variety of processing functions. As described herein, the CPU 102 can implement dynamic voltage transitions, such that the CPU 102 can dictate the amount of supply voltage it requires to perform certain computing functions. For example, at higher performances that require larger computational resources, the CPU 102 can require a higher supply voltage. Conversely, when the CPU 102 does not require large computational resources, the CPU 102 may only require a small supply voltage, thereby conserving power. To dictate the amount of supply voltage necessary for the appropriate computational resources, the CPU 102 provides a voltage identification (VID) signal, shown in the example of FIG. 1 as a signal VID (hereinafter, "the VID signal").

In the example of FIG. 1, the computer system 100 includes a voltage regulator 104 configured to provide an output voltage $V_{OUT}$ at an output capacitor $C_{OUT}$ to the CPU 102, such that the output voltage $V_{OUT}$ is the supply voltage to the CPU 102. The voltage regulator 104 includes a plurality N of power stages 106, where N is a positive integer. The power stages 106 each provide a separate voltage $V_1$ through $V_N$ at respective inductors $L_1$ through $L_N$, such that the voltages $V_1$ through $V_N$ can collectively be the output voltage $V_{OUT}$ based on selective activation of the power stages 106. The voltage regulator 104 includes a power controller 108 that is configured to selectively activate the power stages 106 based on the VID signal, such that the currents provided via some or all of the voltages $V_1$ through $V_N$ combine to form the output voltage $V_{OUT}$ at an amplitude that is defined by the VID signal. In the example of FIG. 1, the selective activation is shown as pulse-width modulation (PWM) signals $PWM_1$ through $PWM_N$ that are provided to the respective power stages 106 to control the providing of and/or the amplitude of the respective voltages $V_1$ through $V_N$.

In the example of FIG. 1, the power controller 108 includes a VID signal decoder ("VID DECODER") 110 that is configured to decode the VID signal to determine the requested supply voltage amplitude by the CPU 102. The VID signal decoder 110 includes a coarse resolution decoder 112 and a fine resolution decoder 114. As an example, the coarse resolution decoder 112 can operate in the digital domain and the fine resolution decoder 114 can operate in the analog domain. The coarse resolution decoder 112 an provide a first digital signal that is the decoded VID signal, such as based on a more rapid decoding of the VID signal than the fine resolution decoder 114. Conversely, the fine resolution decoder 114 an provide a second digital signal that is the decoded VID signal, such as based on a more accurate decoding of the VID signal than the coarse resolution decoder 112. As described in greater detail herein, the VID signal decoder 110 can be configured to decode the VID signal based on a combination of the first and second digital signals, and thus in both a rapid and accurate manner, to provide a rapid and accurate response of providing the output voltage $V_{OUT}$ to the amplitude requested by the CPU 102 via the VID signal.

Figure 2:
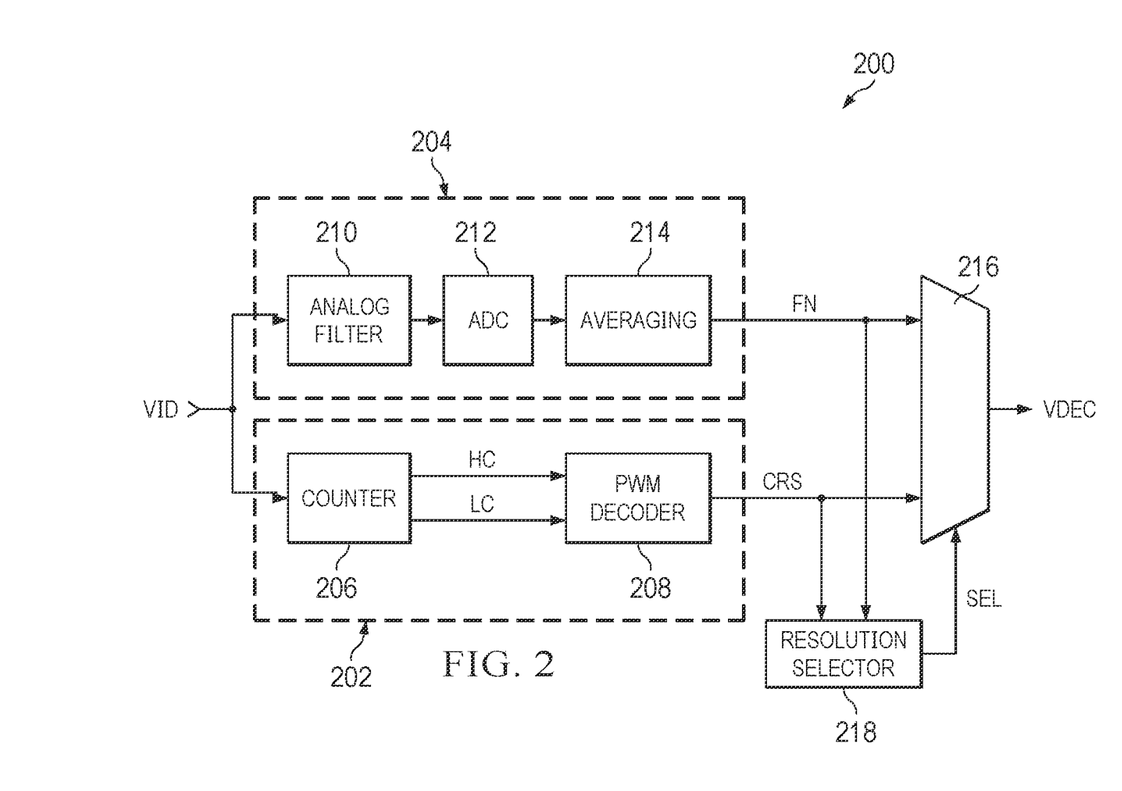
FIG. 2 is an example of a voltage identification signal decoder.

FIG. 2 is an example of a VID signal decoder 200. As described herein, the VID signal decoder 200 can be implemented as a combination of hardware, firmware, and/or software to decode the VID signal. The VID signal decoder 200 can be the VID signal decoder 110 in the example of FIG. 1. Therefore, reference is to be made to the example of FIG. 1 in the following description of the example of FIG. 2.

The VID signal decoder 200 includes a coarse resolution decoder 202 and a fine resolution decoder 204. The coarse and fine decoders 202 and 204 are each configured to receive the VID signal and to separately and independent decode the VID signal concurrently. As an example, the VID signal can be provided as a PWM signal having a duty-cycle that is an encoded amplitude of the output voltage $V_{OUT}$ that is the supply voltage requested by the CPU 102. For example, the VID signal can have an eight-bit signal encoded therein to specify the amplitude of the output voltage $V_{OUT}$ to the CPU 102. Therefore, each of 1/256 steps, and thus approximately 0.4% of change in the duty-cycle of the PWM VID signal, can be a single discrete voltage amplitude step (e.g., approximately 5 mV). As described in greater detail herein, the coarse resolution decoder 202 operates in the digital domain to decode the PWM VID signal, while the fine resolution decoder 204 operates in the analog domain to decode the PWM VID signal.

The coarse resolution decoder 202 includes a counter 206 and a PWM decoder 208. The counter 206 can be configured to sample each period of the VID signal to determine logic-high portions of the period relative to logic-low periods of the period, thereby determining an approximate duty-cycle of the VID signal for a given period of the VID signal. The counter 206 can thus determine a quantity of high counts HC and a quantity of low counts LC for a given period of the VID signal. The high counts HC can be an on-time of the duty-cycle and the low counts LC can be the off-time of the duty-cycle are each provided to the PWM decoder 208, such that the PWM decoder 208 can determine an approximate PWM duty-cycle of the VID signal. As an example, the PWM decoder 208 can implement a decoding algorithm to generate the first digital signal, shown in the example of FIG. 2 as a signal CRS, based on a relative difference between the on-time and the off-time of the PWM VID signal.

As an example, the decoding algorithm can be implemented by the PWM decoder 208 as a binary search algorithm configured to iteratively compare the duty-cycle with a target code that changes by a binary value at each most-significant bit at each iteration to decode the first digital signal. The binary search algorithm can be or can operate similar to a successive approximation registers (SAR) algorithm. Therefore, to determine the duty-cycle of the PWM VID signal, the binary search algorithm can be implemented in lieu of a division operation, thereby conserving processing power and time.

For example, the binary search algorithm can convert the determined on-time TON relative to off-time TOFF of the duty-cycle of the PWM VID signal into a first digital signal that is an eight-bit coarse duty-cycle code CRS. The coarse duty-cycle code CRS can be expressed as follows:

$$CRS=TON/(TON+TOFF)*256 \quad \text{Equation 1}$$

$$CRS*(TON+TOFF)=TON*256 \quad \text{Equation 2}$$

Initially, the target code can be set as a seven-bit code 1000000, which is one-half of an eight-bit code, and therefore a digital value of 128 is a 50% duty-cycle. Thus, the PWM decoder 208 can compare the TON*256 term with the initial target code*(TON+TOFF) term to determine if the duty-cycle of the PWM VID signal is greater than or less than 50%. The binary search algorithm can thus set the most significant bit (MSB) of the target code to a logic-1 or logic-0 depending on whether the duty-cycle of the PWM VID signal is greater than or less than 50%, respectively. Then, the binary search algorithm can iteratively step down to the next highest MSB, set the value to logic-1, and iteratively compare the TON*256 term with the (TON+TOFF)*updated target code term.

As a first example, the first iterative comparison determines that the TON*256 term is greater than the initial target code 1000000*(TON+TOFF) term, and thus the duty-cycle of the PWM VID signal is greater than 50%. Therefore, the binary search algorithm sets the MSB of the target code to a logic-1. Then, the binary search algorithm iteratively steps down to the next highest MSB and sets the value to logic-1 to iteratively compare the TON*256 term with the updated target code 1100000*(TON+TOFF) term. Therefore, the binary search algorithm can determine whether the duty-cycle of the PWM VID signal is greater than or less than 75%.

As a second example, the first iterative comparison determines that the TON*256 term is less than the initial target code 1000000*(TON+TOFF) term, and thus the duty-cycle of the PWM VID signal is less than 50%. Therefore, the binary search algorithm sets the MSB of the target code to a logic-0. Then, the binary search algorithm iteratively steps down to the next highest MSB and sets the value to logic-1 to iteratively compare the TON*256 term with the updated target code 0100000*(TON+TOFF) term. Therefore, the binary search algorithm can determine whether the duty-cycle of the PWM VID signal is greater than or less than 25%.

The binary search algorithm can therefore iteratively provide the comparison at each bit of the target code down to the least significant bit (LSB) of the target code. Therefore, the binary search algorithm can provide for the eight-bit coarse duty-cycle code CRS that is the duty-cycle of the PWM VID signal in eight system clock cycles. The binary search algorithm can therefore be very rapidly implemented (e.g., in microseconds) to generate the coarse duty-cycle code CRS. However, due to sampling errors associated the counter 206, the coarse duty-cycle code CRS may be accurate only to approximately six MSBs. Therefore, the coarse resolution decoder 202 can provide a very rapid, but slightly less accurate, decoding of the PWM VID signal. As an example, the PWM decoder 208 can provide the eight-bit coarse duty-cycle code CRS as an output upon completion of the binary search algorithm, or can provide the updated target code continuously as an output until the updated target code is completed as the eight-bit coarse duty-cycle code CRS.

The fine resolution decoder 204 includes an analog filter 210, an analog-to-digital converter (ADC) 212, and an averaging component 214. The analog filter 210 can be configured to filter the period of the PWM VID signal to generate an analog voltage that is the duty-cycle of the PWM VID signal. For example, the analog filter 210 can be a low-pass filter having a time constant TRC that is significantly less than the time of the period of the PWM VID signal. As an example, the analog filter 210 can be implemented as a fifth order passive RC filter that provides attenuation of approximately 54 dB at worst case corners at approximately 400 kHz. Thus, the analog filter 210 can have a time constant of approximately 30 µs to provide an accurate analog signal of the duty-cycle of the PWM VID signal after approximately 200 µs. The analog signal of the duty-cycle of the PWM VID signal can thus be provided to the ADC 212 to provide a digital value of the duty-cycle of the PWM VID signal, which can be averaged by the averaging component 214 (e.g., over a predetermined quantity of consecutive periods of the PWM VID signal) to provide a second digital signal that is a fine duty-cycle code FN. Accordingly, the fine resolution decoder 204 can provide a very accurate, but slightly less rapid, decoding of the PWM VID signal.

The duty-cycle codes CRS and FN from the coarse resolution decoder 202 and the fine resolution decoder 204, respectively, are provided to a multiplexer 216. The multiplexer 216 is configured to provide one of the duty-cycle codes CRS and FN as an output signal VDEC based on a logic state of a selection signal SEL. The logic state of the selection signal SEL can thus control whether the coarse resolution decoder 202 provides the coarse duty-cycle code CRS or the fine resolution decoder 204 provides the fine duty-cycle code FN as the output signal VDEC. The output signal VDEC is thus implemented by the power controller 108 (e.g., via a digital-to-analog converter (DAC)) to control the amplitude of the output voltage $V_{OUT}$ based on selective activation of the power stages 106 via the respective signals $PWM_1$ through $PWM_N$.

In the example of FIG. 2, the selection signal SEL is generated by a resolution selector 218. The resolution selector 218 is configured to monitor the duty-cycle codes CRS and FN to determine a logic state of the selection signal SEL. Thus, the resolution selector 218 can provide the selection signal SEL at a first logic state to provide the coarse duty-cycle code CRS as the output signal VDEC or at a second logic state to provide the fine duty-cycle code FN as the output signal VDEC. As an example, the resolution selector 218 can set the logic state of the selection signal SEL based on a difference between the duty-cycle codes CRS and FN. For example, the resolution selector 218 can set the selection signal SEL to the first logic state in response to a difference between the duty-cycle codes CRS and FN being greater than a predetermined threshold, and can set the selection signal SEL to the second logic state in response to the difference between the duty-cycle codes CRS and FN being less than the predetermined threshold. As an example, the predetermined threshold can be two LSBs of the respective duty-cycle codes CRS and FN.

For example, in response to a change in the PWM VID signal, both the coarse resolution decoder 202 and the fine resolution decoder 204 can concurrently operate to generate the respective duty-cycle codes CRS and FN that are the updated duty-cycle of the PWM VID signal. However, as described above, the coarse duty-cycle code CRS can be more rapidly generated by the coarse resolution decoder 202 than the fine duty-cycle code FN generated by the fine resolution decoder 204. Therefore, in response to the generation of the coarse duty-cycle code CRS by the coarse resolution decoder 202, the coarse duty-cycle code CRS can be greater than the fine duty-cycle code FN by more than the predetermined threshold. Therefore, the resolution selector 218 can provide the selection signal SEL at the first logic state, such that the multiplexer 216 can provide the coarse duty-cycle code CRS provided by the coarse resolution decoder 202 as the output signal VDEC. Accordingly, the power controller 108 can selectively activate the power stages 106 to rapidly change the amplitude of the output voltage $V_{OUT}$ to the amplitude of the output signal VDEC defined by the coarse duty-cycle code CRS.

Continuing the above example, while the output voltage $V_{OUT}$ settles to the amplitude of the output signal VDEC, as dictated by the coarse duty-cycle code CRS, the fine resolution decoder 204 continues to decode the PWM VID signal. Eventually, the resolution selector 218 can identify that the difference between the duty-cycle codes CRS and FN is within the predetermined threshold (e.g., within two LSBs). As described above, the fine resolution decoder 204 can provide a more accurate decoding of the PWM VID signal. Therefore, in response to the difference between the duty-cycle codes CRS and FN is within the predetermined threshold, the resolution selector 218 can change the selection signal SEL from the first logic state to the second logic state, such that the multiplexer 216 provides the fine duty-cycle code FN from the fine resolution decoder 204 as the output signal VDEC. Accordingly, the power controller 108 can selectively activate the power stages 106 to change the amplitude of the output voltage $V_{OUT}$ to the amplitude of the output signal VDEC defined by the fine duty-cycle code FN. Therefore, the output voltage $V_{OUT}$ can be adjusted to the more accurate amplitude defined by the fine duty-cycle code FN. As a result, the VID signal decoder 200 can provide for a rapid reaction to the change in the duty-cycle of the PWM VID signal that is a requested change in supply voltage by the CPU 102 based on the coarse resolution decoder 202, and can ultimately provide for a more accurate amplitude of the output voltage $V_{OUT}$ to the CPU 102 to meet the demands of the requested supply voltage to the CPU 102.

Figure 3:
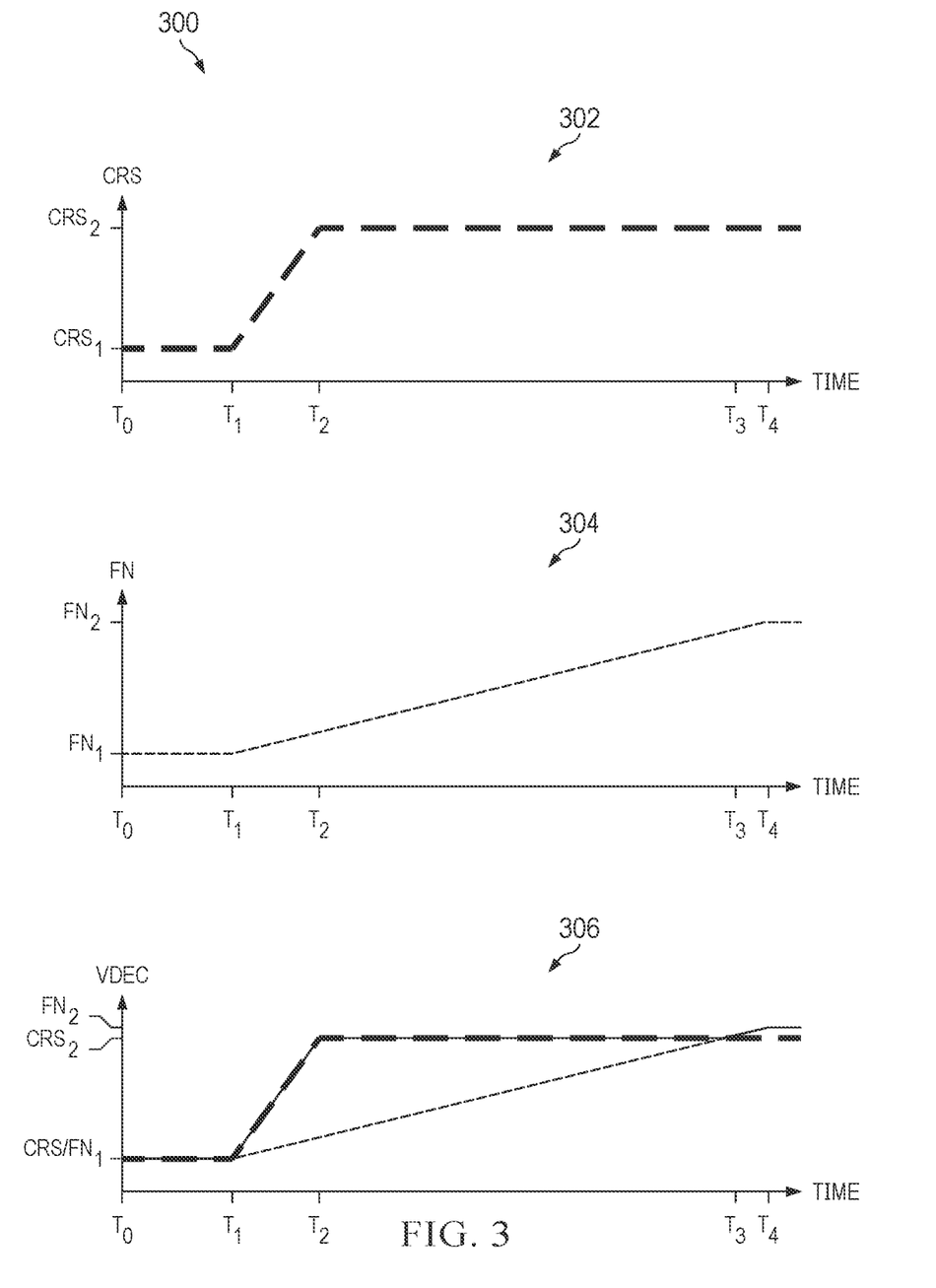
FIG. 3 is an example of a timing diagram.

FIG. 3 is an example of a timing diagram 300. The timing diagram 300 includes a first diagram 302, a second diagram 304, and a third diagram 306. The diagrams 302, 304, and 306 are shown as coterminous in time, such that the diagrams 302, 304, and 306 are time-aligned. The first diagram 302 demonstrates the amplitude of the coarse duty-cycle code CRS provided by the coarse resolution decoder 202 as a dashed line over time. The second diagram 304 demonstrates the amplitude of the fine duty-cycle code FN provided by the fine resolution decoder 204 as a dotted line over time. The third diagram 306 demonstrates the amplitude of the output signal VDEC provided by the multiplexer 216 as a thick solid line, as well as the duty-cycle codes CRS and FN superimposed therein, over time. As shown in the example of FIG. 3, the duty-cycle codes CRS and FN and the output signal VDEC are plotted as representative of time-based convergence to amplitudes, and are not necessarily intended to represent time-based slew of changing values. The timing diagram 300 can describe the decoding of the PWM VID signal over time by the VID signal decoder 200. Therefore, reference is to be made to the example of FIG. 2 in the following description of the example of FIG. 3.

Initially, at a time $T_0$, the PWM VID signal has a first duty-cycle that is a first amplitude of the output voltage $V_{OUT}$. The first amplitude of the output voltage $V_{OUT}$ can be relatively low, such as based on a lower processing requirement by the CPU 102. Thus, at the time $T_0$, the coarse duty-cycle code CRS can have an initial value of $CRS_1$ and the fine duty-cycle code FN can have an initial value of $FN_1$. At a time $T_1$, the CPU 102 changes the duty-cycle of the PWM VID signal, such as to request a greater amplitude of the output voltage $V_{OUT}$. Therefore, at the time $T_1$, both the coarse resolution decoder 202 and the fine resolution decoder 204 concurrently operate to generate the respective duty-cycle codes CRS and FN that are each the updated duty-cycle of the PWM VID signal. In the first diagram 302, at the time $T_1$, the coarse duty-cycle code CRS begins to rapidly increase, while in the second diagram 304, at the time $T_1$, the fine duty-cycle code FN begins to slowly increase.

As an example, the PWM decoder 208 can provide the updated target code continuously as an output until the updated target code is completed as the eight-bit coarse duty-cycle code CRS. Therefore, very shortly after the time $T_1$ (e.g., after a first iteration of the binary search algorithm), the coarse duty-cycle code CRS that is the updated target code can be greater than the fine duty-cycle code FN by greater than the predetermined threshold. Therefore, the resolution selector 218 can provide the selection signal SEL at the first logic state, such that the multiplexer 216 can provide the coarse duty-cycle code CRS provided by the coarse resolution decoder 202 as the output signal VDEC. As a result, in the third diagram 306, the output signal VDEC is provided as the coarse duty-cycle code CRS, and thus rapidly increases.

At a time $T_2$, the coarse duty-cycle code CRS converges to the value of the PWM VID signal, as decoded by the coarse resolution decoder 202, at a value of $CRS_2$. Accordingly, the power controller 108 can selectively activate the power stages 106 to rapidly change the amplitude of the output voltage $V_{OUT}$ to the amplitude of the output signal VDEC defined by the coarse duty-cycle code CRS having the value $CRS_2$. After the time $T_2$, the fine resolution decoder 204 continues to decode the updated PWM VID signal, and thus continues to converge upon a value that is the duty-cycle of the PWM VID signal.

At a time $T_3$, the difference between the duty-cycle codes CRS and FN can be within the predetermined threshold (e.g., 2 LSBs). Therefore, the resolution selector 218 switches the selection signal from the first logic state to the second logic state. Accordingly, the multiplexer 216 provides the fine duty-cycle code FN as the output signal VDEC. In the example of FIG. 3, at a time $T_4$, the fine duty-cycle code FN converges to the value of the PWM VID signal, as decoded by the fine resolution decoder 204, at a value of $FN_2$ that is slightly greater than the value $CRS_2$. Therefore, the output signal VDEC increases slightly from the value $CRS_2$ to the value $FN_2$ that is the more accurate decoded value of the duty-cycle of the PWM VID signal. As a result, the VID signal decoder 200 can provide for a rapid reaction to the change in the duty-cycle of the PWM VID signal that is a requested change in supply voltage by the CPU 102 based on the coarse resolution decoder 202, and can ultimately provide for a more accurate amplitude of the output voltage $V_{OUT}$ to the CPU 102 to meet the demands of the requested supply voltage to the CPU 102.

Figure 4:
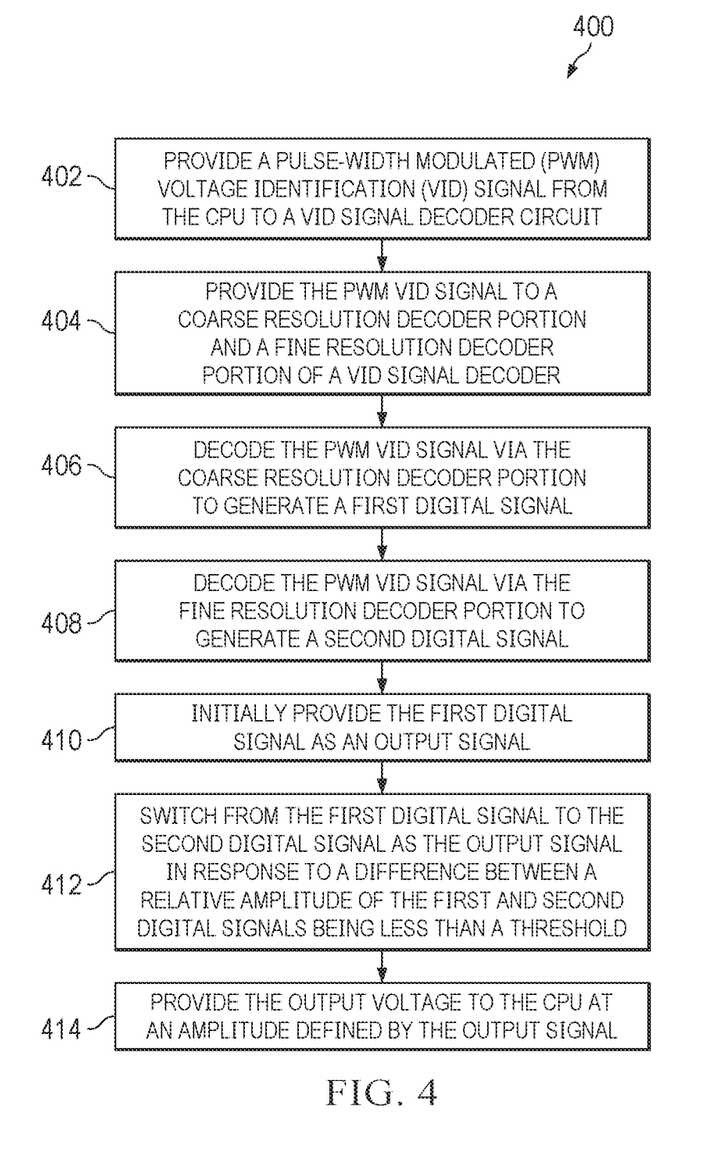
FIG. 4 is an example of a method for adaptively providing an output voltage to a CPU.

In view of the foregoing structural and functional features described above, an example method will be better appreciated with reference to FIG. 4. While, for purposes of simplicity of explanation, the method is shown and described as executing serially, the method is not limited by the illustrated order, as parts of the method could occur in different orders and/or concurrently from that shown and described herein. Such method can be executed by various components configured in an integrated circuit, processor, or a controller, for example.

FIG. 4 illustrates an example of a method 400 for adaptively providing an output voltage to a CPU (e.g., the CPU 102). At 402, a PWM VID signal (e.g., the PWM VID signal) is provided from the CPU to a VID signal decoder circuit (e.g., the VID signal decoder 110). The VID signal can be encoded with a digital value that is a requested input voltage from the CPU. At 404, the PWM VID signal is provided to a coarse resolution decoder (e.g., the coarse resolution decoder 202) and a fine resolution decoder (e.g., the fine resolution decoder 204) of the VID signal decoder. At 406, the PWM VID signal is decoded via the coarse resolution decoder to generate a first digital signal (e.g., the coarse duty-cycle code CRS). At 408, the PWM VID signal is decoded via the fine resolution decoder to generate a second digital signal (e.g., the fine duty-cycle code FN). At 410, the first digital signal is initially provided as an output signal (e.g., the output signal VDEC). At 412, the output signal is switched from the first digital signal to the second digital signal in response to a difference between a relative amplitude of the first and second digital signals being less than a threshold. At 414, the output voltage is provided to the CPU at an amplitude defined by the output signal.

In this description, the term "couple" may cover connections, communications, or signal paths that enable a functional relationship consistent with this description. For example, if device A generates a signal to control device B to perform an action, then: (a) in a first example, device A is directly coupled to device B; or (b) in a second example, device A is indirectly coupled to device B through intervening component C if intervening component C does not alter the functional relationship between device A and device B, so device B is controlled by device A via the control signal generated by device A.

Also, in this description, a device that is "configured to" perform a task or function may be configured (e.g., programmed and/or hardwired) at a time of manufacturing by a manufacturer to perform the function and/or may be configurable (or reconfigurable) by a user after manufacturing to perform the function and/or other additional or alternative functions. The configuring may be through firmware and/or software programming of the device, through a construction and/or layout of hardware components and interconnections of the device, or a combination thereof. Furthermore, a circuit or device described herein as including certain components may instead be configured to couple to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor wafer and/or integrated circuit (IC) package) and may be configured to couple to at least some of the passive elements and/or the sources to form the described structure, either at a time of manufacture or after a time of manufacture, such as by an end user and/or a third party.

The techniques described herein may also be embodied or encoded in an article of manufacture including a non-transitory computer-readable storage medium. Example non-transitory computer-readable storage media may include random access memory (RAM), read-only memory (ROM), programmable ROM, erasable programmable ROM, electronically erasable programmable ROM, flash memory, a solid-state drive, a hard disk, magnetic media, optical media, or any other computer readable storage devices or tangible computer readable media. The term "non-transitory" may indicate that the storage medium is not embodied in a carrier wave or a propagated signal. In certain examples, a non-transitory storage medium may store data that can, over time, change (e.g., in RAM or cache).

Modifications are possible in the described embodiments, and other embodiments are possible, within the scope of the claims.

What is claimed is:

1. A circuit comprising:
   a coarse resolution decoder configured to receive a voltage identification (VID) signal; and to decode the VID signal to generate a first digital signal;
   a fine resolution decoder configured to receive the VID signal and to decode the VID signal to generate a second digital signal; and
   a multiplexer coupled to the coarse resolution decoder and to the fine resolution decoder, the multiplexer configured to provide the first digital signal as an output signal responsive to a first state of a selection signal and to provide the second digital signal as the output signal responsive to a second state of the selection signal, the first and second states of the selection signal being based on a relative amplitude of the first and second digital signals.

2. The circuit of claim 1, further comprising a resolution selector configured to monitor the first and second digital signals, to generate the selection signal at the first state responsive to a difference between the first and second digital signals being greater than a threshold, and to generate the selection signal at the second state responsive to the difference between the first and second digital signals being less than the threshold.

3. The circuit of claim 2, wherein the threshold is a value represented by two least-significant bits between the first and second digital signals.

4. The circuit of claim 1, wherein the VID signal is pulse-width modulated (PWM) VID signal comprising a duty-cycle representative of a digital value of an output voltage.

5. The circuit of claim 4, wherein the coarse resolution decoder comprises:
   a counter configured to determine an on-time and an off-time of each period of the PWM VID signal; and a PWM decoder configured to implement a decoding algorithm to generate the first digital signal based on a relative difference between the on-time and the off-time of the PWM VID signal.

6. The circuit of claim 5, wherein the decoding algorithm comprises a binary search algorithm configured to iteratively compare the duty-cycle with a target code that changes by a binary value at each most-significant bit at each iteration to decode the VID signal to generate the first digital signal.

7. The circuit of claim 4, wherein the fine resolution decoder comprises:
an analog filter configured to filter the PWM VID signal configured to generate an analog signal representative of the duty-cycle of the PWM VID signal;
an analog-to-digital converter (ADC) configured to generate a digital representation of the analog signal representative of the duty-cycle of the PWM VID signal; and
an averaging component configured to continuously generate an average of the digital representation to decode the VID signal configured to generate the second digital signal.

8. A power controller comprising the circuit of claim 1, the power controller being configured to receive the VID signal from a central processing unit (CPU) and to selectively activate power stages to provide respective contributions to an output voltage based on a value of the output signal to adaptively control the output voltage to the CPU.

9. An integrated circuit (IC) comprising a voltage regulator, the voltage regulator comprising the power controller of claim 8, and further comprising the power stages.

10. A circuit comprising:
a coarse resolution decoder having a first voltage identification (VID) signal input configured to receive a VID signal and a first digital output, the coarse resolution decoder configured to provide a first digital signal at the first digital output;
a fine resolution decoder having a second VID signal input configured to receive the VID signal and a second digital output, the fine resolution decoder configured to provide a second digital signal at the second digital output;
a multiplexer having a first multiplexer input coupled to the first digital output of the coarse resolution decoder, a second multiplexer input coupled to the second digital output of the fine resolution decoder, a selection input, and a multiplexer output, the multiplexer configured to provide one of the first digital signal or the second digital signal at the multiplexer output; and
a resolution selector having a first input coupled to the first digital output of the coarse resolution decoder, a second input coupled to the second digital output of the fine resolution decoder, and a selection output coupled to the selection input of the multiplexer.

11. The circuit of claim 10, wherein the resolution selector is configured to monitor the first and second digital signals and to generate a selection signal at the selection output at a first state responsive to a difference between the first and second digital signals being greater than a threshold, and to generate the selection signal at a second state responsive to the difference between the first and second digital signals being less than the threshold.

12. The circuit of claim 11, wherein the threshold is a value represented by two least-significant bits between the first and second digital signals.

13. The circuit of claim 10, wherein the VID signal input is configured to receive a pulse-width modulated (PWM) VID signal having a duty-cycle representative of a digital value of an output voltage from a central processing unit (CPU).

14. The circuit of claim 13, wherein the coarse resolution decoder comprises:
a counter configured to determine an on-time and an off-time of periods of the PWM VID signal; and
a PWM decoder configured to implement a decoding algorithm to generate the first digital signal based on a relative difference between the on-time and the off-time of the PWM VID signal, wherein the decoding algorithm comprises a binary search algorithm configured to iteratively compare the duty-cycle with a target code that changes by a binary value at a remaining most-significant bit at each iteration to decode the VID signal to generate the first digital signal.

15. The circuit of claim 13, wherein the fine resolution decoder comprises:
an analog filter configured to filter the PWM VID signal to generate an analog signal representative of the duty-cycle of the PWM VID signal;
an analog-to-digital converter (ADC) configured to generate a digital representation of the analog signal representative of the duty-cycle of the PWM VID signal; and
an averaging component configured to continuously generate an average of the digital representation to decode the VID signal to generate the second digital signal.

16. A circuit comprising
power stages adapted to be coupled to a central processing unit (CPU); and
a power controller configured to receive a voltage identification (VID) signal from the CPU, the VID signal being encoded with a digital value of an output voltage from the CPU, and to selectively activate the power stages based on a value of an output signal to adaptively control the output voltage to the CPU, the power controller comprising a VID decoder circuit, the VID decoder circuit comprising:
a coarse resolution decoder configured to receive the VID signal, and to decode the VID signal to generate a first digital signal;
a fine resolution decoder configured to receive the VID signal and to decode the VID signal to generate a second digital signal; and
a multiplexer configured to provide the first digital signal as the output signal responsive to a first state of a selection signal and to provide the second digital signal as the output signal responsive to a second state of the selection signal, the first and second states of the selection signal being based on a relative amplitude of the first and second digital signals.

17. The circuit of claim 16, the VID decoder circuit further comprising a resolution selector configured to monitor the first and second digital signals, to generate the selection signal at the first state responsive to a difference between the first and second digital signals being greater than a threshold, and to generate the selection signal at the second state responsive to the difference between the first and second digital signals being less than the threshold, wherein the threshold is a value represented by two least-significant bits between the first and second digital signals.

18. The circuit of claim 16, wherein the VID signal is pulse-width modulated (PWM) VID signal comprising a duty-cycle representative of the digital value.

19. The circuit of claim 18, wherein the coarse resolution decoder comprises:

a counter configured to determine an on-time and an off-time of periods of the PWM VID signal; and a PWM decoder configured to implement a binary search decoding algorithm to generate the first digital signal based on a relative difference between the on-time and the off-time of the PWM VID signal, wherein the binary search decoding algorithm is configured to iteratively compare the duty-cycle with a target code that changes by a binary value at a remaining most-significant bit at each iteration to decode the first digital signal.

20. The circuit of claim 18, wherein the fine resolution decoder comprises:

an analog filter configured to filter the PWM VID signal to generate an analog signal representative of the duty-cycle of the PWM VID signal;

an analog-to-digital converter (ADC) configured to generate a digital representation of the analog signal representative of the duty-cycle of the PWM VID signal; and an averaging component configured to continuously generate an average of the digital representation to decode the second digital signal.

* * * * *